US007868886B2

(12) United States Patent
Ackermans et al.

(10) Patent No.: US 7,868,886 B2
(45) Date of Patent: Jan. 11, 2011

(54) STATISTICAL STREAMING

(75) Inventors: Peter Ackermans, Waalwijk (NL); Gerard Kerkhofs, Dongen (NL); Edwin Schild, Hardinxveld Giessendam (NL)

(73) Assignee: Hottinger Baldwin Measurements Inc., Marlborough, MA (US)

( * ) Notice: Subject to any disclaimer, the term of this patent is extended or adjusted under 35 U.S.C. 154(b) by 1222 days.

(21) Appl. No.: 11/205,114

(22) Filed: Aug. 17, 2005

(65) Prior Publication Data

US 2006/0181440 A1 Aug. 17, 2006

(30) Foreign Application Priority Data

Jan. 5, 2005 (GB) .................................. 0500089.8

(51) Int. Cl.
*G06T 11/20* (2006.01)
*G09G 5/22* (2006.01)
(52) U.S. Cl. .................................... 345/440; 345/440.1
(58) Field of Classification Search .................. 345/440
See application file for complete search history.

(56) References Cited

U.S. PATENT DOCUMENTS

| | | | | | |
|---|---|---|---|---|---|
| 5,138,252 | A | * | 8/1992 | Ferguson | 324/76.19 |
| 5,218,299 | A | * | 6/1993 | Dunkel | 324/307 |
| 5,255,365 | A | * | 10/1993 | Hungerbuhler | 345/440.1 |
| 5,375,067 | A | * | 12/1994 | Berchin | 702/66 |
| 5,397,981 | A | * | 3/1995 | Wiggers | 324/121 R |
| 5,740,064 | A | * | 4/1998 | Witte et al. | 702/70 |
| 5,898,420 | A | * | 4/1999 | Timm | 345/440.1 |
| 5,939,877 | A | * | 8/1999 | Alexander | 324/121 R |
| 6,201,384 | B1 | * | 3/2001 | Alexander | 324/121 R |
| 6,344,844 | B1 | * | 2/2002 | Timm et al. | 345/440.1 |
| 6,356,849 | B1 | * | 3/2002 | Jaffe | 702/66 |
| 6,374,251 | B1 | * | 4/2002 | Fayyad et al. | 707/101 |
| 6,457,144 | B1 | * | 9/2002 | Eberhard | 714/45 |
| 6,642,926 | B1 | * | 11/2003 | Letts | 345/440.1 |
| 6,693,576 | B2 | * | 2/2004 | Azinger | 341/155 |
| 6,725,172 | B2 | * | 4/2004 | McTigue et al. | 702/117 |
| 6,760,673 | B2 | * | 7/2004 | Genther et al. | 702/75 |
| 7,489,825 | B2 | * | 2/2009 | Sirohey et al. | 382/244 |
| 2005/0043598 | A1 | * | 2/2005 | Goode et al. | 600/316 |

FOREIGN PATENT DOCUMENTS

JP 2001-272421 10/2001

* cited by examiner

*Primary Examiner*—M Good Johnson
(74) *Attorney, Agent, or Firm*—Baker & Hostetler LLP

(57) ABSTRACT

A method of providing a display signal, wherein digital data to be displayed has associated with it statistical values determined for pre-determined sized blocks of the digital data, comprising the steps of: determining display scaling parameters; determining from the display scaling parameters the extent to which the statistical values are suitable to use in place of some or all of the digital data when determining which data points of either the digital data and/or statistical values to display; determining the data points to display; reading the digital data and/or statistical values to be displayed; and generating the display signal from the digital data and/or statistical values.

8 Claims, 9 Drawing Sheets

STATISTICAL STREAMING

CROSS REFERENCE TO RELATED APPLICATIONS

This application claims priority to United Kingdom Patent Application Serial No. 0500089.8 filed Jan. 5, 2005 entitled, STATISTICAL STREAMING, the disclosure of which is incorporated by reference in its entirety.

FIELD OF THE PRESENT INVENTION

This invention relates to the field of data recording for display and analysis. Particularly, but not exclusively, the invention relates to increasing the speed at which a computer can display a user selection of recorded data samples from a recorded data file and increasing the speed at which a computer can compute and display relevant statistics for that selection of recorded data, especially when dealing with extremely large data files.

BACKGROUND TO THE PRESENT INVENTION

In the data acquisition and storage industry, it is common for large amounts of data to be recorded. The amount of data stored is increasing rapidly. The capacity of computer storage, such as hard disks, is increasing accordingly every year and new technologies for allowing multiple disks to be used collectively are being developed. To keep pace, data transfer methods have been developed to move larger volumes of data, witnessed by the use of Firewire®, USB2 and gigabit Ethernet technologies to transfer data being taken up by mainstream computer manufacturers. As it becomes possible for progressively larger amounts of data to be recorded and transferred in real time, the size of the files recorded has increased to allow greater measurement precision. This creates a problem when handling the resultant data files using the kind of computers typically available in offices, e.g. for the analysis of industrial or scientific measurements, as even though personal computers have also increased in speed and capability, they cannot yet process whole recording files, now in the order of gigabytes, in real time as expected by the user.

In the real world, the handling of large amounts of data using a personal computer typically requires reading the data from the hard drive into a memory, processing the data in the memory as required and then either storing the results or discarding the processed values. When the recorded data files are larger than the 256 Mb to 512 Mb of high bandwidth solid-state memory (also known as Random Access Memory) used currently in personal computers, then the data cannot be fully cached in this solid-state memory and has to be partially, or wholly, read either directly from the hard drive or using a memory substitution file that is known in the art as a swap file, with the associated decrease in speed, before the processor can carry out any selected mathematical operations on the data.

In the future computers will undoubtedly have an increased amount of solid-state memory and more processing power, but if the size of the data files keeps increasing at the same rate as personal computer capabilities increase, then this problem will remain.

The purpose of the invention is, therefore, to aid in overcoming the above problems.

SUMMARY OF THE PRESENT INVENTION

Accordingly the present invention provides a method of providing a display signal, wherein digital data to be displayed has associated with it statistical values determined for pre-determined sized blocks of the digital data, comprising the steps of: determining display scaling parameters; determining from the display scaling parameters the extent to which the statistical values are suitable to use in place of some or all of the digital data when determining which data points of either the digital data and/or statistical values to display; determining the data points to display; reading the digital data and/or statistical values to be displayed; and generating the display signal from the digital data and/or statistical values.

The present invention provides a system for providing a display signal, wherein digital data to be displayed has associated with it statistical values determined for predetermined sized blocks of the digital data, comprising: display scaling parameter determination means; processing means for determining, from the display scaling parameters, the extend to which the statistical values are suitable to use in place of some or all of the digital data when determining which data points of either the digital data and/or statistical values to display; processing means for determining which data points to display; data reading means for reading the digital data and/or statistical values to be displayed; and display means for generating the display signal from the digital data and/or statistical values.

The present invention provides a computer program product for providing a display signal, the computer program product comprising a computer useable medium having computer readable code thereon, including program code comprising: instructions and data for causing a processor to perform determination of display scaling parameters; determination, from the display scaling parameters, the extent to which the statistical values are suitable to use in place of some or all of the digital data when determining which data points of either the digital data and/or statistical values to display; determination of the data points to display; reading of the digital data and/or statistical values to be displayed; and generation of the displayed signal from the digital data and/or statistical values.

With the benefit of the present invention there is provided a method to avoid reading the entirety of a very large data file, and to rapidly produce a display of all or part of the data without losing key characteristics of the data, such as peaks.

Further, the above method can be applied to the ever larger data files expected in the foreseeable future through the use of additional statistical streams.

Also, the present invention can provide a faster method of calculating various statistical data requested by a user viewing the data, for all or part of the data, once the data has been displayed.

Further features and advantages of the invention will become apparent from the claims, to which the reader is referred, and from a consideration of the following description of preferred embodiments of the invention and variations thereof, made with reference to the accompanying drawings in which like reference symbols indicate the same or similar components.

DESCRIPTION OF THE PREFERRED EMBODIMENTS

The data are typically time-varying values of a measured physical quantity such as temperature, position, speed, concentration or light intensity. Thus their values are likely, in applications envisaged for this invention, to vary continuously as a function of time. However, even values with significant discontinuities can be used.

The preferred embodiment of the present invention provides a data acquisition system designed to receive an analogue signal, sample the signal at a predetermined sampling rate and record the sampled data to a raw data file. The user of the system can set up custom measurement protocols to record this data based on their measurement needs. At the same time as recording this data, the system calculates a statistical summary for blocks of raw data of a predetermined size and stores this statistical data such that it is associated with the raw data file of samples taken from the signal. The data considered useful by the end user can then be stored and analysed.

The data acquisition system of the present embodiment is preferably provided in a standalone unit that contains the recording equipment, memory on which the data files are recorded, computer equipment to process the results, and a display with which to view the results. However, it is envisaged that some or all of these components can be provided in separate modules, each with the capability to interact via a communication system such as, for example, an Ethernet connection between the recording equipment and the computer and display equipment as shown in FIG. 1.

Figure 1:
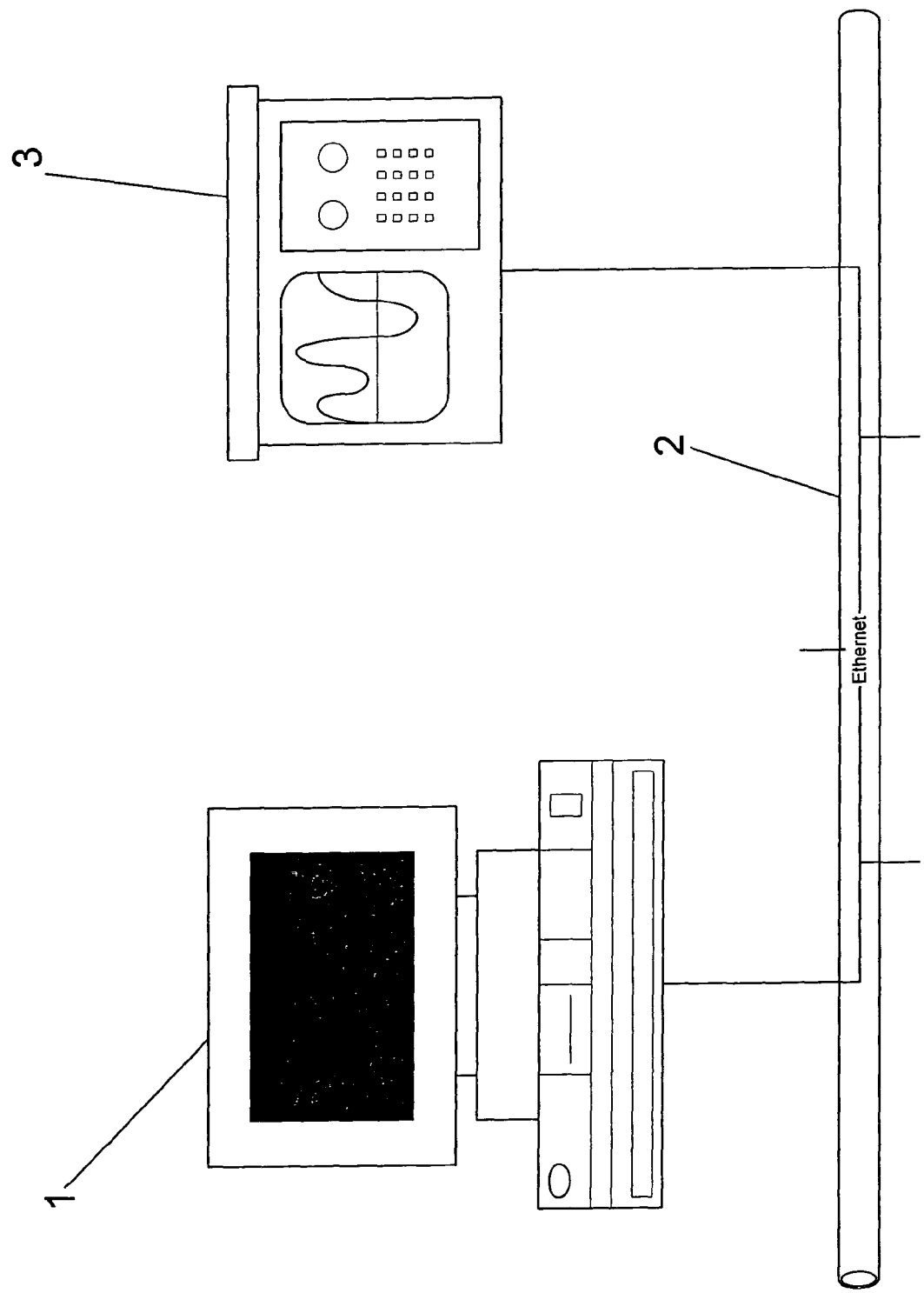
FIG. 1 is a block diagram showing a standard personal computer connected via a standard Ethernet data network to a data sampling and recording device embodying the present invention.
Figure 2:
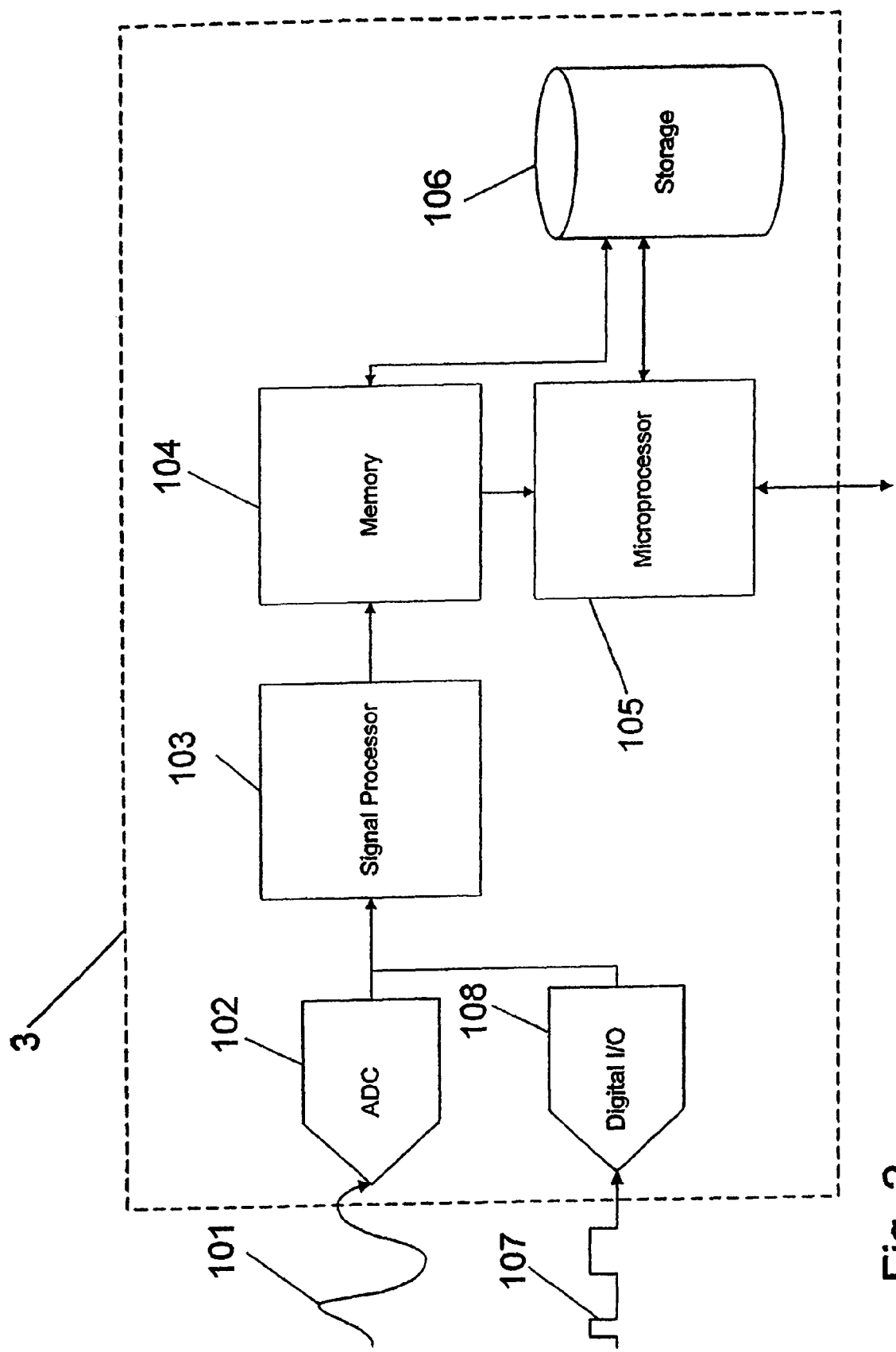
FIG. 2 is a block diagram showing more detail of the data sampling and recording device of FIG. 1.
Figure 3:
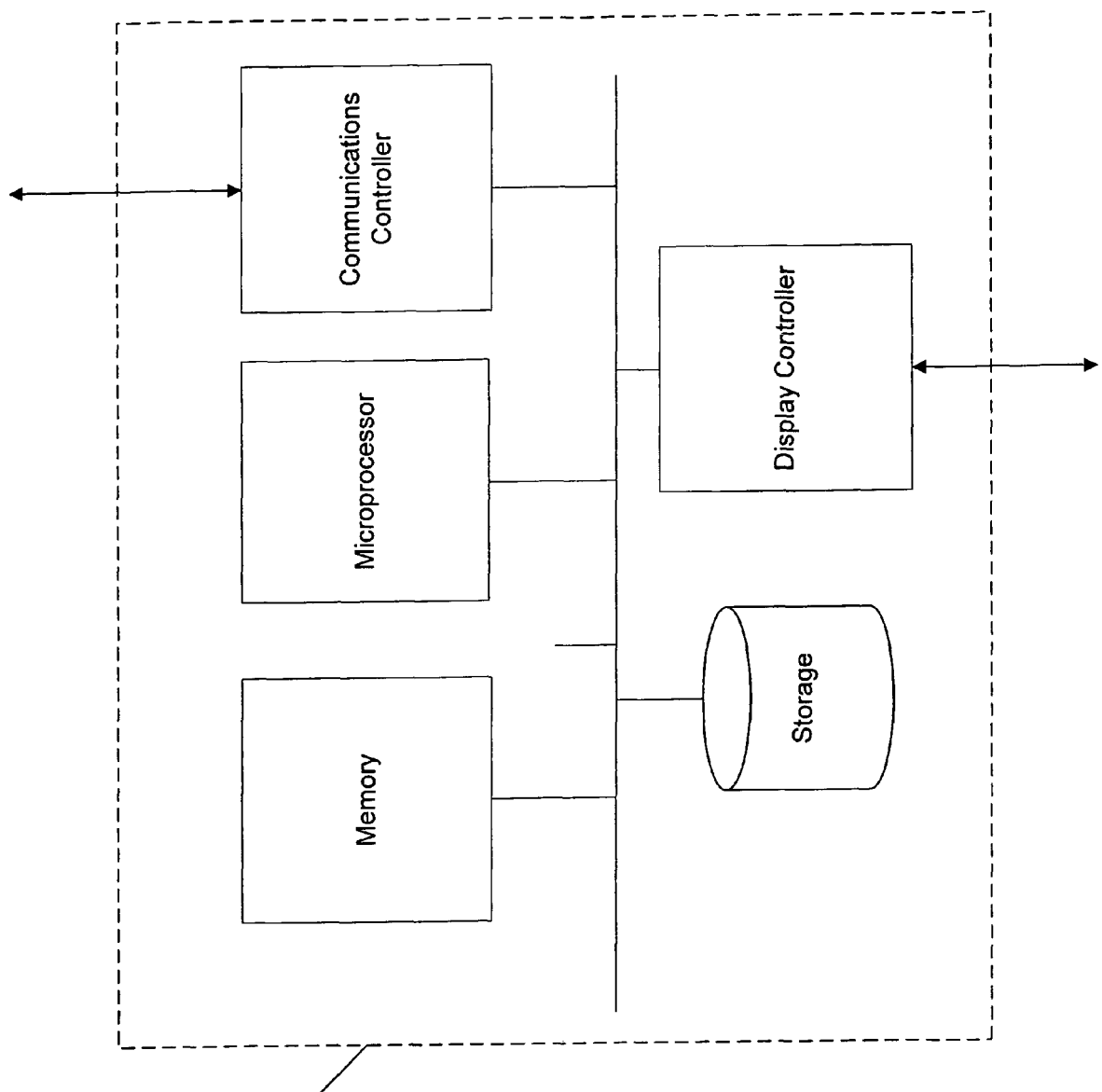
FIG. 3 is a simplified block diagram showing internal details for the personal computer, suitable for use with the embodiment of FIG. 1.

With reference to FIG. 1, in which there is shown the separate modular approach described above, there is provided a personal computer 1 connected to a data recording device 3 via an Ethernet data network 2. The personal computer 1 is provided with display means on which results can be displayed. The data recording device 3 houses the recording system and a network interface controller, for communicating via the Ethernet data network with the personal computer 1. The personal computer 1 can display the recorded data, which can be stored on any suitable storage medium, located for example in the data recording system 3 or on the computer 1.

It is envisaged that other communications methods can be used to allow the recording device to communicate with the computer, and also the computer with the display. These methods include, but are not limited to, wireless networking apparatus such as Bluetooth and 802.11b, and direct cable connections such as USB and/or Firewire. It is also envisaged that the personal computer 1 can be any computing device capable of processing the stored data samples in such a way as to display them, and therefore can take the form of a standard desktop or laptop such as an Intel or AMD based IBM compatible PC, or even a handheld device such as a Pocket PC.

Data 101 is received from an analogue data source such as a sensor, for example a heat sensor, pressure sensor or such like. The received data is then fed into an Analogue to Digital Converter (ADC) 102. The ADC 102 samples the analogue signal 101 at a predetermined sampling rate and feeds digital sampled data into a signal processor. In alternative embodiments, the input signal may already be digital, or may be loaded from a storage device having been gathered earlier. If the data is already in digital form it can bypass the analogue to digital conversion step, or be processed by a digital converter into the correct format for the Signal Processor 103.

Figure 8:
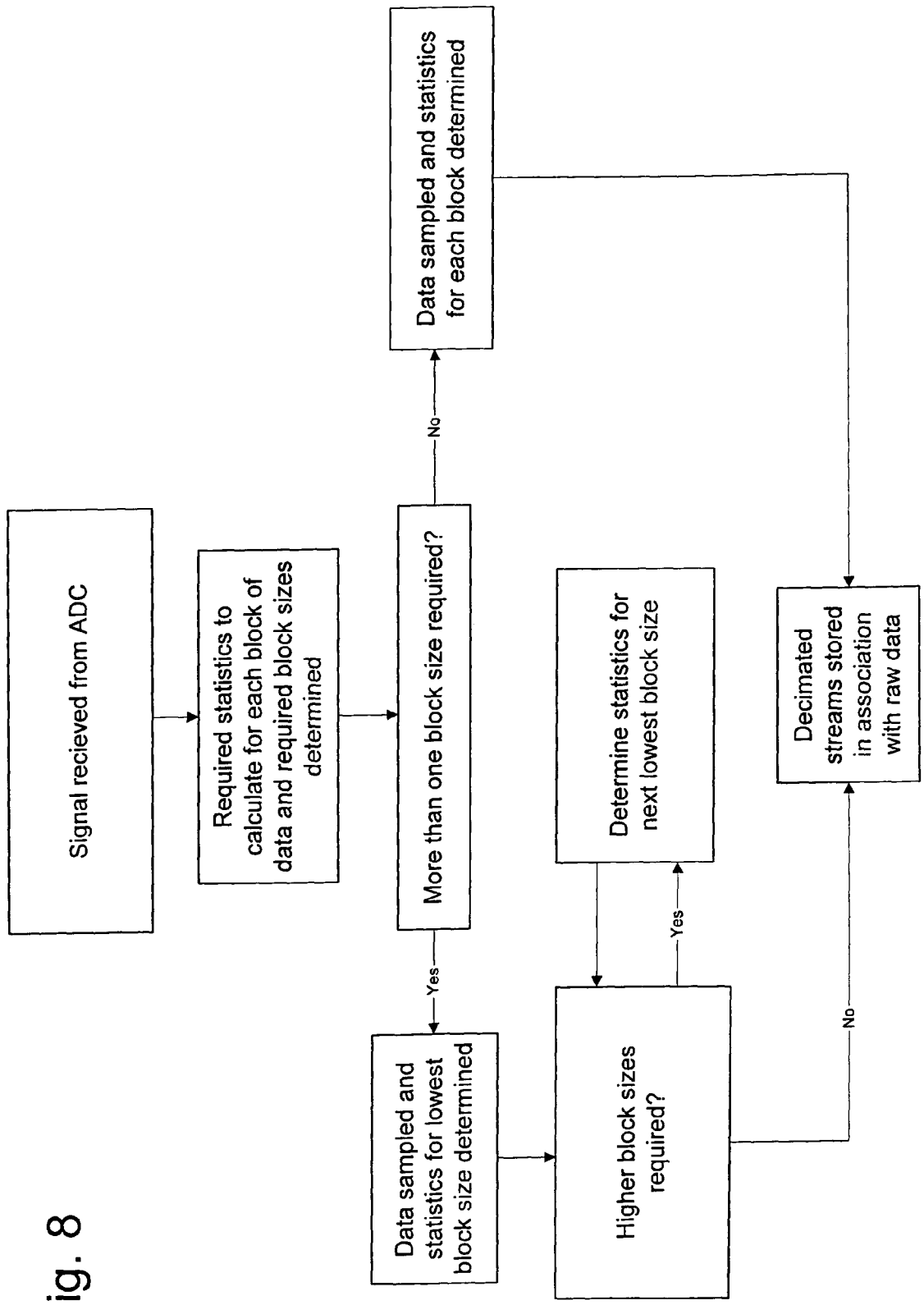
FIG. 8 is a flowchart showing an outline of the process of generating decimated streams when taking samples of a signal and producing raw data.

As shown in FIG. 8, the Signal Processor 103 processes the signal received from the ADC 102. It receives the data and calculates various statistics for predetermined sized blocks of the inputted sampled data, and outputs one or more decimated streams of statistical data associated with the raw input data. In the most basic embodiment, these separate decimated data streams keep track of the minimum and maximum sample values for each predetermined sized block of data. In this embodiment, there are decimated data streams storing the absolute maximum and absolute minimum sample values for blocks of 500 data samples, but it is envisaged that other sized datasets can be used.

The form of the Signal Processor 103 can be determined as necessary by the skilled person depending on the volume and rate at which data needs to be sampled, and is envisaged to take the form of a Field Programmable Gate Array (FPGA) if there is a large volume of data needing to be processed, or a software based DSP (Digital Signal Processor) when there is a lesser volume of data. The faster FPGA device would be needed if many statistical streams are needed.

To create the decimated data streams, several methods can be used which can be implemented in either hardware or software. Any software based Digital Signal Processor (DSP) is capable of multiplying and adding the raw data samples. DSPs have dedicated multipliers and adders available to perform this function. If sample rates start to increase, a hardware based solution would be more appropriate, as for instance modern FPGAs and or CPLDs are available with dedicated multipliers and adder support. As, in the future, our sample rates start to increase, the power of DSPs as well as the speed of FPGA/CPLDs should increase accordingly. To extract the decimated data stream out of the raw sample stream in real time, the best fit between software based DSP or hardware based FPGA/CPLD method thus can be selected.

The decimated streams may be used without the raw data to allow a user, in effect, to view large amounts of sampled data on a size-limited display area without noticeable lag due to the processing of all of the raw data by the computer. This use of the decimated streams also allows the characteristic features of the raw data such as peaks and valleys to be retained, as will be explained later when detailing the method of displaying the data.

The Signal Processor 103 can optionally be adapted to provide additional statistical calculations to aid later statistical analysis of user-selected parts of the data, again without processing delays noticeable to the user. Depending on which statistical parameters are stored, further statistical calculations can be displayed rapidly, for example: the r.m.s. (Root Mean Square); the STD (Standard Deviation) and the mean (Average Value) of a user selected portion of data.

The rapid calculation of these further statistics, when a portion of data is selected by a user, requires certain values to be quickly available. For instance, the above statistical calculations require the start and end points of the selected raw data to define on which portion of data to perform the mathematical functions. These values are quickly available once the user has selected the data.

However, for the same calculations, the sum of the samples and the sum of the squares of the samples within a block need to be calculated for the user selected portion of data. This would take a significant time for a large volume of data. Therefore, in a more advanced embodiment where the calculation process is sped up, either or both of the sum of the samples and the sum of the squares of the samples are pre-calculated by the Signal Processor at the recording stage and included in one or more additional statistical streams.

For instance, the root mean square calculation $X_{RMS}$ mentioned above can be calculated by the computer for a collection of N values $\{x_1, x_2, \ldots, x_N\}$ of the raw data using the following equation:

$$X_{RMS} = \sqrt{\frac{X_1^2 + X_2^2 + \ldots + X_n^2}{N}} \text{ or } X_{RMS} = \sqrt{\frac{1}{N}\sum_{i=1}^{N} X_i^2}$$

the arithmetic mean $\overline{X}$ for a collection of N values $\{x_1, x_2, \ldots, x_N\}$ using the following equation:

$$\overline{X} = \frac{x_1 + x_2 + \ldots + x_N}{N} \text{ or } \overline{X} = \frac{1}{N}\sum_{i=1}^{N} x_i$$

and the standard deviation $\sigma$ for a collection of N values $\{x_1, x_2, \ldots, x_N\}$ can be calculated using the following equation:

$$\sigma = \sqrt{\frac{1}{N}\sum_{i=1}^{N} x_i^2 - \left(\frac{1}{N}\sum_{i=1}^{N} x_i\right)^2}$$

Thus, to evaluate these equations at an increased speed, the computer could use previously-stored values of either or both the sum of the samples and the sum of the squares of the samples and insert them into the equation without needing to read a large amount of data and perform a calculation.

In the embodiment, for the above example calculations, the sum of values and the sum of squared values are stored for data blocks of 500 samples. As soon as the computer needs to perform an RMS calculation, it can extract the required values from these decimated data streams and use a single intermediate result for each dataset of 500 samples instead of processing all 500 samples of raw data. This then gives the user fast access to the RMS value of any selected section of the sequential raw data, i.e. any selected period during the transmission of the raw data in real time.

In another embodiment, the Signal Processor 103 has the further ability to output decimated streams for larger sized data blocks. In order to speed up this process for very large data files, the sum of samples and the sum of squares of samples for every 100,000 samples are stored in one or more separate decimated streams. For even larger files, the summed results for every 10,000,000 samples are added in one or more further decimated data streams. As file sizes grow, it is envisaged that this concept can be extended by providing summation results for even larger data blocks. It must be understood that the sizes of the data blocks that have been selected as examples are not limited to these arbitrary values, and it is possible that the size of data block can be selected to be larger or smaller accordingly.

The above listed group sizes have been established through experiment as being very adequate group sizes so as not to impact significantly on the additional storage required for the statistical data. Using data block sizes of 500, 100,000 and 10,000,000 samples to produce decimated streams for all of the statistical calculations mentioned in the above embodiments will only increase the storage required by the recorded data by about 2.5%. However, there is no need to use fixed decimation sizes, and any decimation size and any number of decimated data streams are possible.

It is possible to optimise the amount of extra disk storage required versus the need to speed up the math functions during display in order to maintain a satisfactory level of performance of the computer when handling the data for display to the end user can be stored as separate files. Intelligent software can be used to determine the optimum size and number of decimation streams. For instance, software can be executed on the workstation handling the end data to determine the responsiveness of the workstation when using data with different decimation factors by increasing the decimation factor incrementally. Once the response level of the workstation meets a predetermined level that has a satisfactory response, the number and size of the decimation streams is set based on the results. Alternatively, the relationship between CPU and hard disk speeds could be used, based on the results of previous tests, to determine a suitable number and size for the decimation streams. However in the current embodiment, the number and size of the decimated streams has been determined manually.

The decimated data stream allows for a block of data of any size. The length of the dataset, i.e. the size of the block of data, is stored within a stream information header for the data stream. This allows for multiple data streams, each having its own unique dataset length covering the next higher decimation factor, and identifiable from its information header. The recording file format in which the streams are stored is organized so that it can contain zero to any number of decimated data streams.

In another embodiment, the number of streams and size of samples needed (or possible) can be calculated by the recording application or device according to necessity of speed versus storage overhead that has been determined. With reference to FIG. 8, the second step of determining the size of blocks and statistics to calculate would be altered to include the step of determining the optimum number of streams and size of samples based on the hardware available and the application for which it is to be used. In the simplest embodiment, to determine at what point the various decimation factors are used, a simple algorithm is employed. Once there are twenty results for each decimation stream, that decimation stream is calculated and stored. So, considering the decimation stream with a factor of 1 in 500, there needs to be 10,000 raw samples. For the stream with a 1 in 100,000 decimation factor there needs to be 2,000,000 raw samples.

The processed sampled data is then stored in a memory 104 and can be manipulated by a microprocessor 105 and/or stored on a storage device 106. The memory 104 can be any type of memory suitable for storing the data output by the Signal Processor 103 until it has been stored, and is envisaged to take the form of, for example, standard computer RAM or flash memory. The storage device 106 is preferably a hard disk drive, but can comprise other forms of storage device such as solid state memory, and does not need to be located within the recording device 3. It is envisaged that the processed sampled data can be stored wherever it can be accessed at the same time as the raw data is accessed.

To display the data, the computer can read the data or the decimated streams from either a local storage medium or, via a communications medium such as an Ethernet network, from the data recording device.

Figure 9:
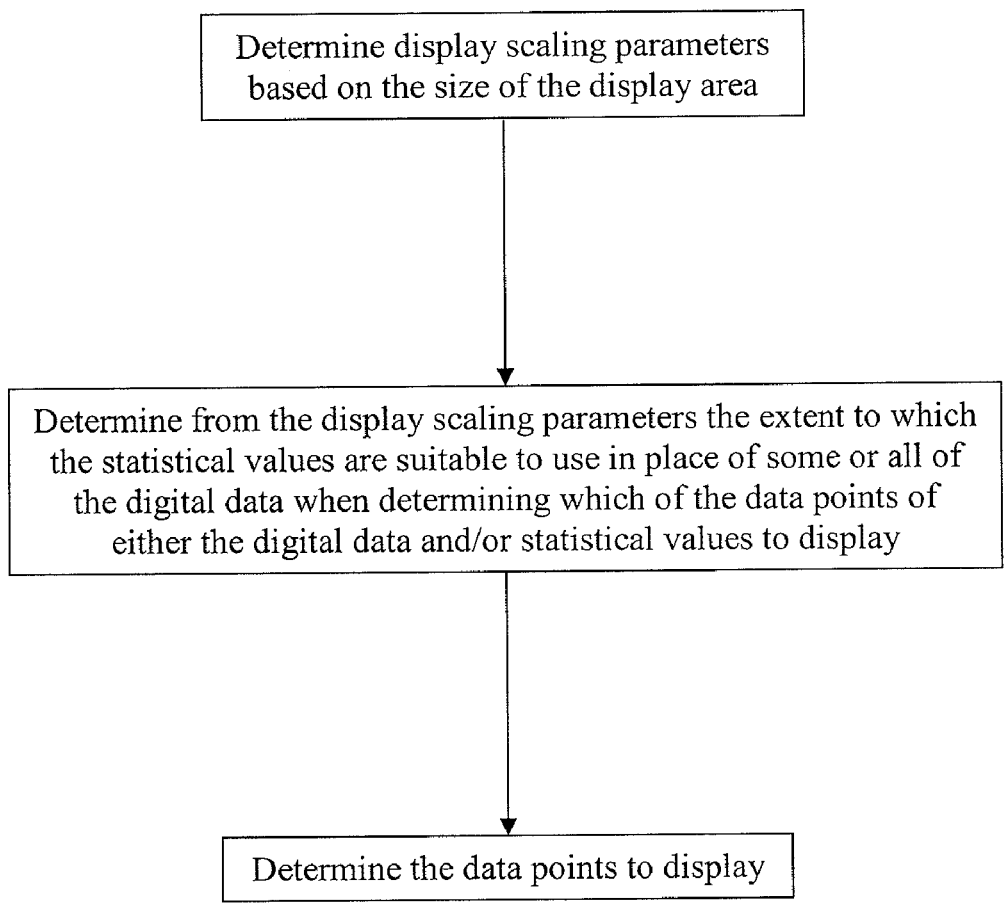
FIG. 9 is a flowchart showing an outline of the process of determining the scaling parameters, statistical values, and data points to use in generating the display.

Referring now to FIG. 9, when displaying the data, the size of display area in which the data, in the form of a trace or suchlike, are to be displayed must be known. Once known, a scaling factor can be determined by which the data must be scaled to fit within the display area. The display area can be a portion, or all, of the display area available. For example, where the entire display area is 1024 pixels by 768 pixels, the area of this display apportioned to display the axes of the data may be 800 pixels by 600 pixels.

In this implementation, every pixel is assigned to a data point, but it is envisaged that a data point can be assigned to every other pixel, meaning only 400 data points need be used to display a trace. Data points can also be assigned to an arbitrary number of pixels, meaning that still fewer data points are displayed.

When the user selects a portion of data to display, the computer reads the raw data. In determining the data points to display, if there are as many sampled data points as pixels (in this example, displaying each data point along the horizontal axis, 800 data points), the selected data samples are read and plotted as a trace on the display. If there are twice as many data points as pixels, every other data point is plotted. This relationship between data points and pixels is maintained, such that where x number of data points need to be displayed, 1 in x points are displayed per pixel.

However, the maximum and minimum values stored in the reduced data stream can be used in place of reading the raw data when the reduction factor reaches the reduction factor of the initial reduced data stream, which is 500 in this example. When there are 500 times as many data samples as display pixels available, the reduced data stream can be used in place of the raw data samples to produce the displayed trace. Thus in this implementation, as the reduced data stream is used to produce the trace, the amount of data the computer needs to read is reduced by a factor of 500.

The use of additional reduced data streams can also be used in the same way. With the use of a decimated stream of data reduced by 100,000 and when there is at least 100,000 times more data points than pixels available to display the trace, this additional decimated stream can be used in place of the raw data. This same principle can be applied using decimated streams of different reduction factors.

Figure 6:
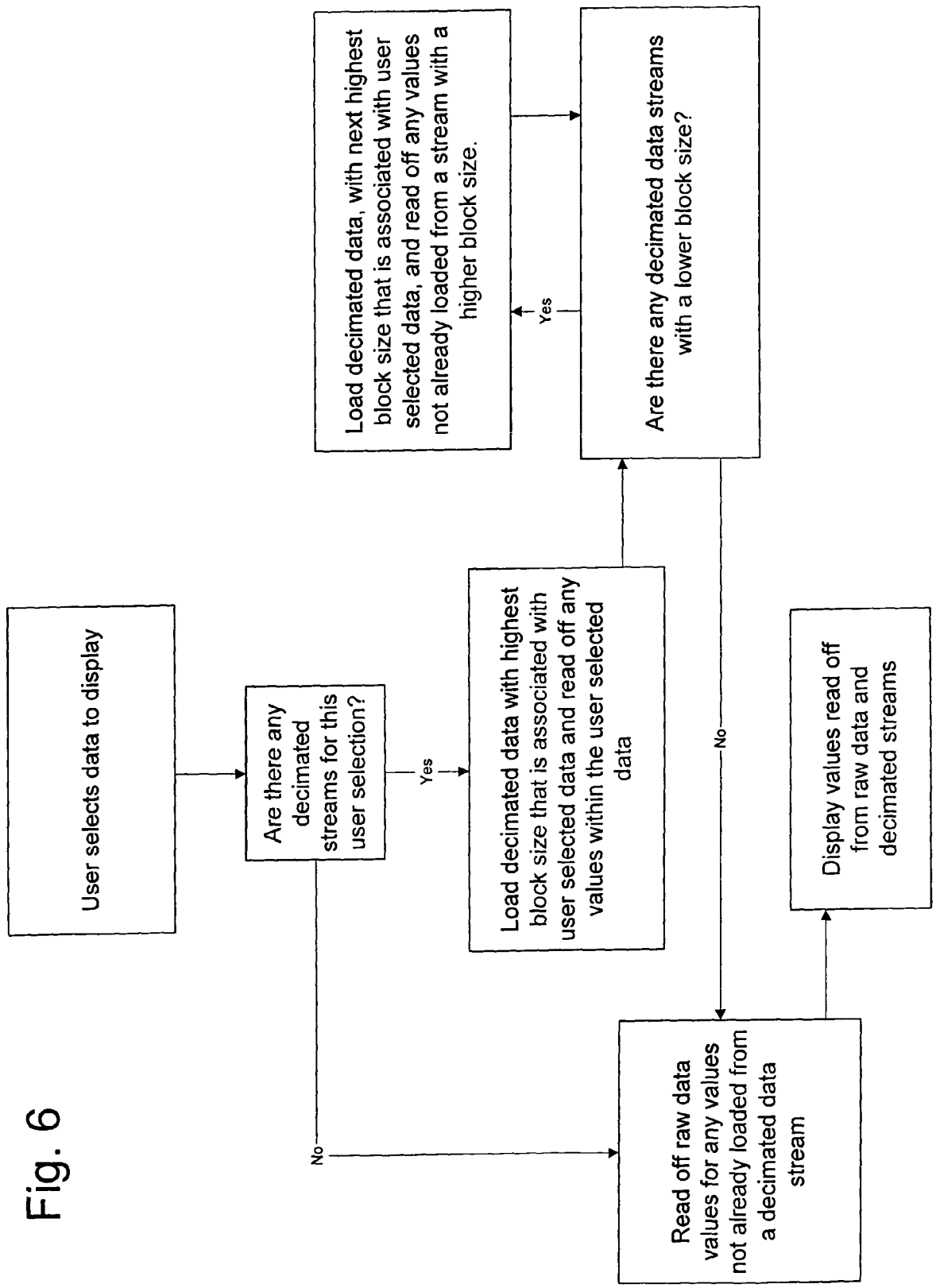
FIG. 6 is a flowchart showing an outline of the process where using decimated data can speed up the display of user selected data.

When considering a user selected portion of data which covers a partial block for which statistical values have been determined and stored in a reduced data stream, and so can not be read solely from a reduced data stream, the computer must perform edge processing, as outlined in FIG. 6.

Edge processing involves the calculation of statistical values for blocks of data without pre-calculated statistics. For instance, where a user selection of data can be divided up into blocks of data for which statistical values have already been calculated except for the initial and final parts of the data, which are only part of blocks of data for which statistical values have been pre-calculated, there is a need to have the relevant statistical values calculated for these data.

If required, other calculated statistical data such as the r.m.s. and standard deviation for all of the data or selections of the data can be displayed on screen, alongside the data points or instead of them.

Figure 4:
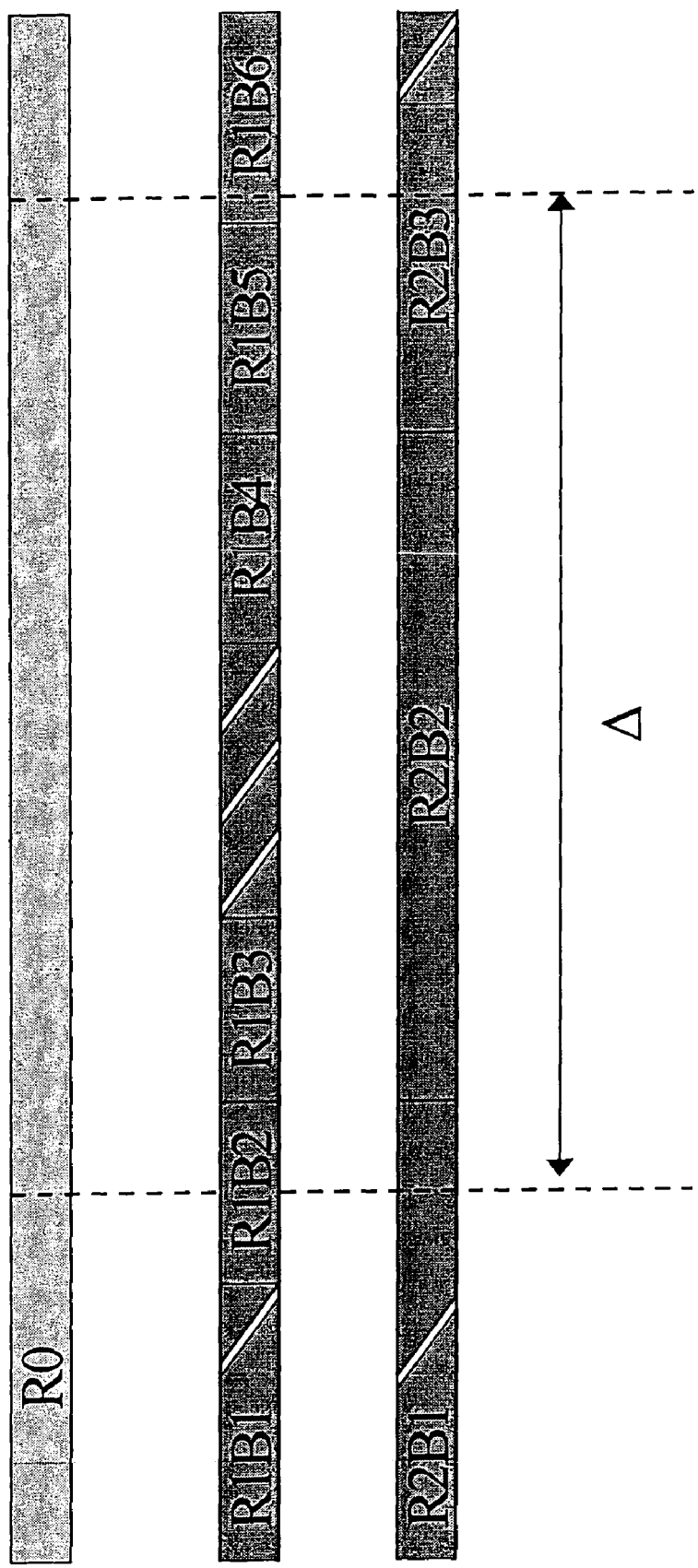
FIG. 4 is a representation showing the raw data alongside two possible decimated statistical streams according to the preferred embodiment of the present invention.
Figure 5:
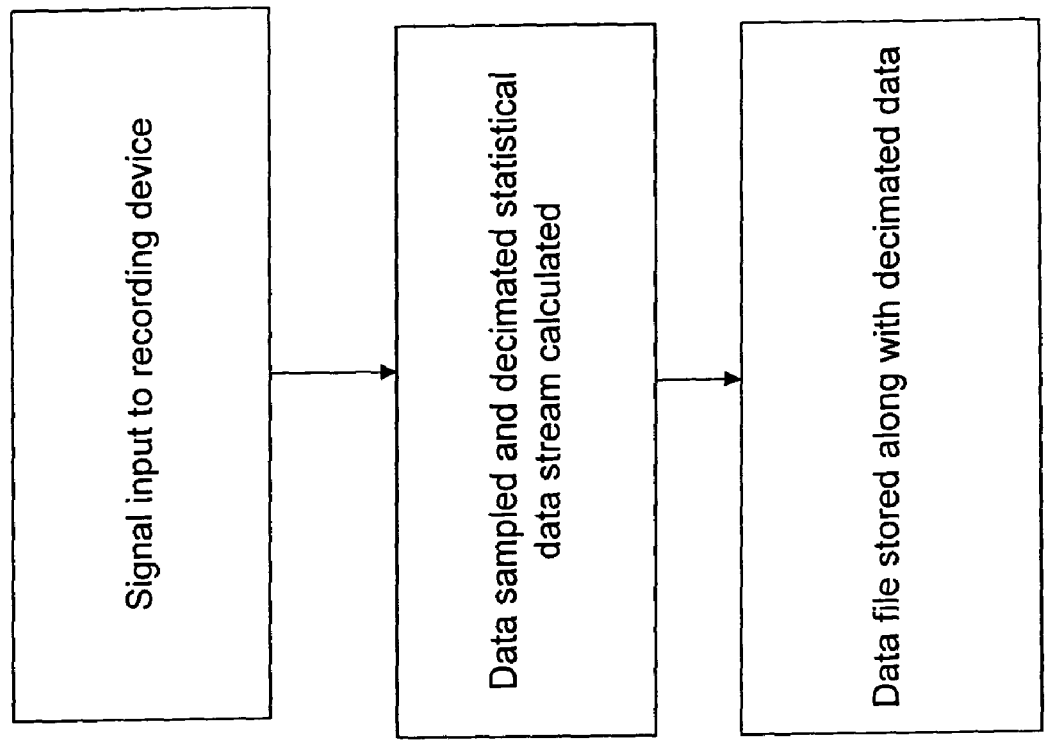
FIG. 5 is a flowchart showing a brief outline of the process of sampling and storing recorded data.

Since the processed statistical data is only available for predetermined blocks of data, a user selection of the raw data is likely to begin within a block and to end within a block, i.e. it spans parts of blocks as well as whole blocks for which statistical data has been calculated. If the user's data selection includes part of a data block for which statistical data has been calculated, and if any statistical data streams using smaller data block sizes are present, the statistical data stream with the highest possible reduction factor is used. If no suitable statistical data stream is available, then the raw data must be used. Thus, the calculation takes the following approach, with reference to the example shown in FIG. 4:

The raw data stream R0 is divided into contiguous blocks of equal size, the block sequence designated by the series B1 . . . Bn and the decimated streams of statistical data designated by the series R1 . . . Rn (each of increasing block size).

The data interval selected by the user, shown as Δ, is covered by two partial blocks of the statistical decimated data for blocks R1B2 and R1B6 with full blocks of statistical decimated data in between. In order to establish the sum of squares of these partial blocks, the computer will need to read the raw samples and calculate the sum of squares for each partial block. With the decimation factor used in this embodiment, this means a maximum of 499 samples on both blocks. Referring to the flowchart in FIG. 6, the process used is shown. Using the process, any decimated streams within the user's data selection are detected and utilised in decreasing size order until there are no decimated streams available to use, at which point the relevant blocks of raw data are read and any relevant statistical data is calculated or the values are displayed. Blocks R1B3 and R1B4 are however covered by the reduction factor. So the computer only needs to read the results from R2B2. The equation therefore needed to be calculated takes the form:

$$X_{RMS} = \sqrt{\frac{\underset{R1B2}{\overset{500}{\underset{i=first}{\sum}} x_i^2} + \underset{R2B2}{SumSqrs} + \underset{R1B5}{SumSqrs} + \underset{R1B6}{\overset{end}{\underset{i=1}{\sum}} x_i^2}}{N}}.$$

Now the computer has to add the results of the partial sums from the raw data, the R2B2 results and the R1B5 results, and it can start the evaluation of the equations. In contrast, imaging the original data would have meant the computer having to read and process 100,000,000 samples.

Thus in this implementation, with decimated streams covering data blocks with a sample size of 500 and 100,000, the maximum amount of data that the computer needs to read is:

2 times 500 samples raw data=1000 samples;
2 times 200 ReducedBy500 results=400 results;
1000 ReducedBy100 k results=1000 results;

bringing the total read size to 2400 results or samples.

Without these data streams it would have been necessary to read 100 million samples and to process the required square operations and additions to match the above approach.

With the additional use of the data stream for blocks of every 10,000,000 samples, the number of reads that the computer needs to perform would be reduced to:

2 times 500 samples raw data=1000 samples;
2 times 200 ReducedBy500 results=400 results;

2 times 100 ReducedBy100 k results=200 results;

10 times ReducedBy100 k results=10 results;

bringing the total read size to 1610 results or samples.

This is not as significant a reduction in read count as the reduction between the number of reads required to process the original data and the number of reads required when using the statistical data stream for every 500 samples. However, as soon as the recording files start to increase to above 1 gigasamples, the difference using the data stream for every 10,000,000 samples becomes extremely significant.

With the additional absolute minimum and absolute maximum values already stored in the initial reduced data stream, the computer can also provide search functions with enhanced speed. Values like the absolute minimum or maximum would be rapidly accessible by initially searching the statistical streams. Any crossing of levels can be searched by checking for where the minimum is lower, and the maximum is higher, than a selected level. When a dataset's minimum and maximum values meet this criteria, the computer would then have to read the relevant portion lower reduced dataset, and finally through the corresponding raw data samples to establish the exact sample that crosses the selected level.

Figure 7:
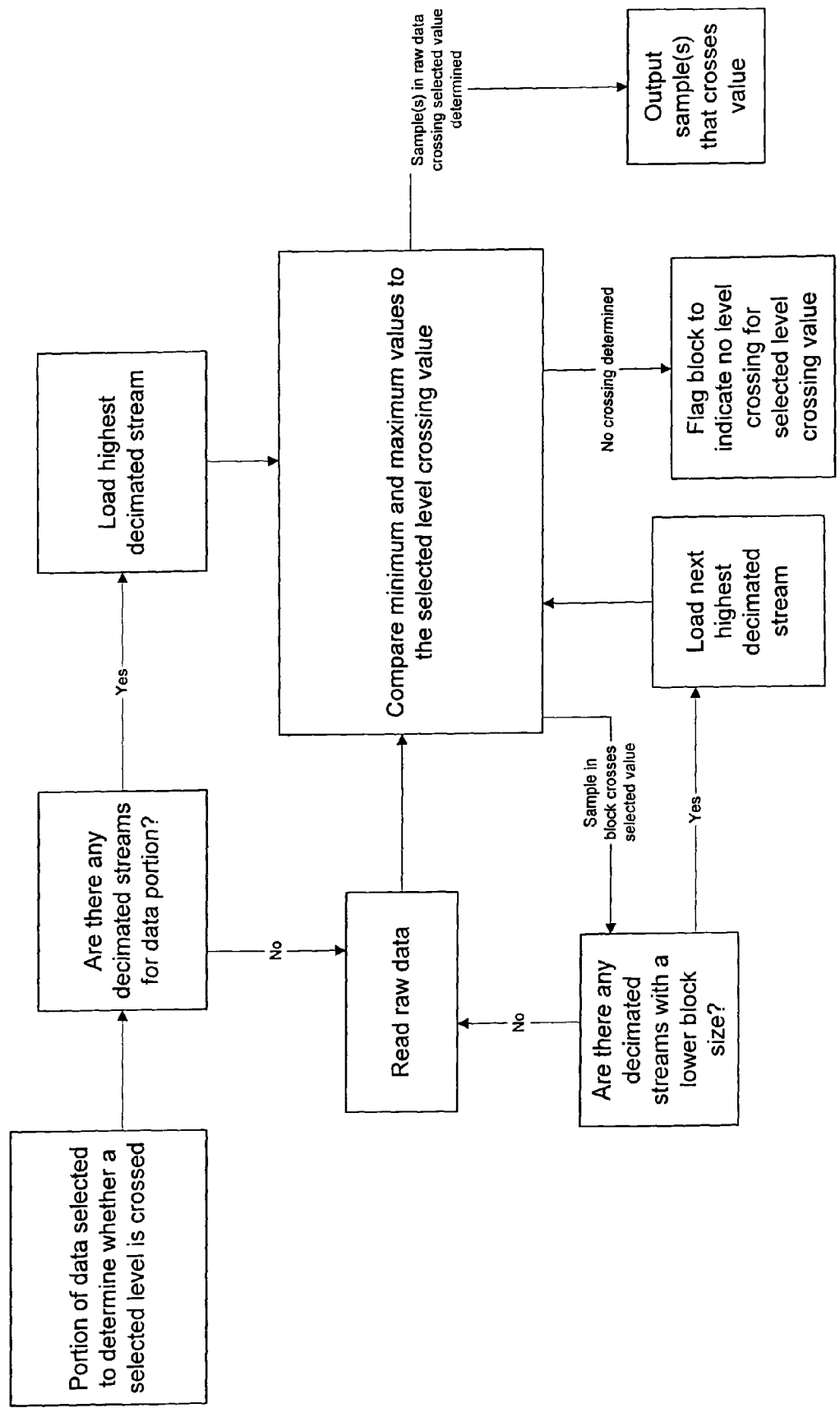
FIG. 7 is a flowchart showing an outline of the level crossing detection process.

Referring to FIG. 7, where the level crossing determination method is outlined, the minimum and maximum values of the highest decimated data stream are compared to the selected level crossing value. If the criteria are not met, the entire block of samples underneath this decimated dataset can be flagged to have no level crossing. If the search criteria do match, the computer then starts going through each lower block size statistical data stream until the actual sample that crosses the selected level has been found in the raw data.

To display the whole of the trace showing the data in the vertical axis, an appropriate scaling factor for the trace must be determined. The computer needs an absolute minimum and absolute maximum value for the trace to be displayed before it can start determining the vertical scale for the display area. The computer will determine the absolute maximum and minimum for the selected data, using the highest block size decimated stream available and progressing down through the lower streams, finally reaching the raw data. This process is herefoth referred to as auto-scaling. If this is disabled, then the end user can set the scaling to any setting desired.

Once the trace has been displayed on the display, and if previously-stored values, such as the sum of the squares of the samples, are stored for each block in additional decimated data streams, statistics can be calculated for the displayed portion of data. Alternatively, or in addition, the user can select a portion of the displayed portion of the data and statistics can be calculated for that portion and displayed.

For instance, in an embodiment where there are statistical streams calculated for absolute minimum, absolute maximum, sum of values and sum of squares of values, and calculated for block sizes of 500, the root mean square can be calculated by the computer for a collection of N values $\{x_1, x_2, \ldots, x_N\}$ of the raw data using the following equation:

$$X_{RMS} = \sqrt{\frac{1}{N}\left(\sum_{i=1}^{500} x_i^2 + \sum_{i=501}^{N} x_i^2\right)}$$

the arithmetic mean $\overline{X}$ for a collection of N values $\{x_1, x_2, \ldots, x_N\}$ using the following equation:

$$\overline{X} = \frac{1}{N}\left(\sum_{i=1}^{500} x_i + \sum_{i=501}^{N} x_i\right)$$

and the standard deviation σ for a collection of N values $\{x_1, x_2, \ldots, x_N\}$ can be calculated using the following equation:

$$\sigma = \sqrt{\frac{1}{N}\sum_{i=1}^{N} x_i^2 - \left(\frac{1}{N}\sum_{i=1}^{N} x_i\right)^2}$$

In the preferred embodiment, all of the above mentioned mathematical calculations are possible, and there is created decimated data streams for block sizes of 500, 100,000 and 10,000,000 that hold:

the value of the sample that represents the lowest value in the data block;

the value of the sample that represents the highest value in the data block;

the sum of the samples of all samples in the data block:

$$\sum_{i=1}^{N} x_i;$$

and the sum of the squares of all samples of all samples in the data block $$\sum_{i=1}^{N} x_i^2.$$

To conclude, as described in the above description there is provided an innovative method for storing the statistical characteristics of a data stream in accompanying data streams and along with the raw data. This method allows a user to display very large data files using a computer much more effectively, as the computer can supplant the raw data with the statistical data to render the display faster than if using conventional methods, where raw data is handled directly.

One application for the statistical data could be creating a new waveform containing all the results stored in the statistical decimated streams. For example, for every 500 points of raw data, a new sample can be supplied from which one or more of the mean value, RMS value and standard deviation of the raw data can be derived. By putting all these values, e.g. RMS values, in this new trace there is produced a derived mathematical channel from the original channel. The statistical traces would show what is called trend signals.

The invention claimed is:

1. A method for displaying digital data using statistical data streams, comprising:

receiving digital data;

determining at least one data block size;

for each data block size;

dividing the digital data into a plurality of data blocks based on the data block size, calculating statistical values by a digital processor, including a minimum value and a maximum value, for each data block, and creating a statistical data stream that includes the statistical values for each data block;

determining display scaling parameters, including a data points-per-pixel value, for a user-selected portion of the digital data;

if at least one data block size is smaller than or equal to the data points-per-pixel value:

selecting at least one statistical data stream having a respective data block size smaller than or equal to the data points-per-pixel value, determining the number of complete data blocks contained within the user-selected portion of the digital data, determining the number of partial data blocks contained within the user-selected portion of the digital data, calculating statistical values for each partial data block, and creating a display signal from the statistical values associated with the complete data blocks and the partial data blocks, and otherwise:

decimating the digital data to create the display signal; and outputting the display signal.

2. The method of claim 1, further comprising:

receiving analog data from an analog data source; and digitizing the analog data, using a digital-to-analog (A/D) converter, to create the digital data.

3. The method of claim 1, wherein the user-selected portion of the digital data includes a portion of an initial data block, at least one complete data block and a portion of a final data block.

4. The method of claim 1, wherein the statistical values include one or more of a root mean square value, a standard deviation value and a mean value.

5. The method of claim 1, wherein the statistical values include one or more of a sum of the digital samples value and a sum of the squares of the digital data samples value.

6. The method of claim 1, wherein the display signal includes both minimum and maximum values.

7. The method of claim 1, wherein:

for a first selected statistical data stream having the largest data block size:

determining a first number complete data blocks that are contained within the user-selected portion of the digital data, and determining a first number of partial data blocks that are contained within the user-selected portion of the digital data;

for a second selected statistical data stream having the next largest data block size:

determining a second number of complete data blocks that are contained within the first number of partial data blocks, and determining a second number of partial data blocks that are contained within the first number of partial data blocks;

processing any remaining selected statistical data streams accordingly until a final number of partial data blocks is determined;

calculating statistical values for each final partial data block; and creating a display signal from the statistical values associated with the complete data blocks, for each statistical data stream, and the final partial data blocks.

8. The method of claim 7, wherein three statistical data streams are created having respective data block sizes of 500, $10^4$ and $10^6$ samples.

* * * * *